(12) United States Patent
Lee

(10) Patent No.: US 8,096,018 B2
(45) Date of Patent: Jan. 17, 2012

(54) HANDLE PIVOT STRUCTURE

(75) Inventor: Hong-Chi Lee, Taipei Hsien (TW)

(73) Assignee: Tekserve Corp., Shijr, Taipei Hsien (TW)

( * ) Notice: Subject to any disclaimer, the term of this patent is extended or adjusted under 35 U.S.C. 154(b) by 207 days.

(21) Appl. No.: 12/623,902

(22) Filed: Nov. 23, 2009

(65) Prior Publication Data

US 2011/0119866 A1 May 26, 2011

(51) Int. Cl.
*A45C 13/22* (2006.01)
*A45F 5/10* (2006.01)
(52) U.S. Cl. ............. 16/110.1; 16/429; 16/438; 16/443
(58) Field of Classification Search ............. 16/436, 16/438, 443, 429, 422, 415, 416; 361/725–728, 361/694, 695, 732, 734, 754, 755, 759, 801; 312/223.2; 439/78, 79, 152, 160
See application file for complete search history.

(56) References Cited

U.S. PATENT DOCUMENTS

| 4,736,356 | A | * | 4/1988 | Konshak | 720/646 |
| 5,321,962 | A | * | 6/1994 | Ferchau et al. | 70/208 |
| 5,765,933 | A | * | 6/1998 | Paul et al. | 312/332.1 |
| 5,926,370 | A | * | 7/1999 | Cromwell | 361/700 |
| 6,003,689 | A | * | 12/1999 | Babineau et al. | 211/41.17 |
| 6,160,717 | A | * | 12/2000 | Desousa et al. | 361/798 |
| 6,185,106 | B1 | * | 2/2001 | Mueller | 361/798 |
| 6,285,548 | B1 | * | 9/2001 | Hamlet et al. | 361/695 |
| 6,708,372 | B2 | * | 3/2004 | Stewart | 16/422 |
| 6,735,089 | B1 | * | 5/2004 | Byers et al. | 361/754 |
| 7,301,768 | B2 | * | 11/2007 | Fan et al. | 361/695 |
| 7,484,975 | B2 | * | 2/2009 | Cheng | 439/159 |

* cited by examiner

*Primary Examiner* — Chuck Y. Mah
(74) *Attorney, Agent, or Firm* — Muncy, Geissler, Olds & Lowe, PLLC

(57) ABSTRACT

A handle pivot structure includes carrier frame, a handle, and a pivot shaft mounted in an axle hole of the handle to pivotally secure the handle to a screw rod of the carrier frame, the pivot shaft having a mounting member threaded onto the screw rod of the carrier member and a rotating member peripherally affixed to the axle hole of the handle and rotatably coupled to the mounting member for allowing biasing of the handle relative to the carrier frame to move an engagement member thereof in an out of an opening on the carrier frame between a locking position and an unlocking position.

6 Claims, 6 Drawing Sheets

HANDLE PIVOT STRUCTURE

BACKGROUND OF THE INVENTION

1. Field of the Invention

The present invention relates to a pivot structure and more particularly, to a handle pivot structure for use in a mobile rack module.

2. Description of the Related Art

The creation of computer brings great convenience to people. Following fast development of computer technology, different computer hardware and software products and other peripheral products have been disclosed and have appeared on the market.

Subject to data processing requirements and the considerations of maintenance convenience and safety reasons, computer parts and peripheral apparatus may be made in a mobile rack design. For example, a mobile hard disk drive is mobile rack design. To enhance the security level, a mobile rack structure usually has a locking mechanism provided between the carrier frame and the rack. The locking mechanism is mounted in the carrier frame for locking/unlocking the rack, for enabling the rack to be inserted into the carrier frame or moved out of the carrier frame.

FIGS. 1 and 2 show a handle pivot structure for mobile rack according to the prior art. According to this design, the handle pivot structure comprises a carrier frame 100 and a handle 200. The handle 200 comprises a stepped axle hole 201 located on its one end, and a cap nut 202 mounted in the stepped axle hole 201. The carrier frame 100 comprises an opening 101, and a screw rod 102 disposed adjacent to the opening 101. During installation, attach a screwdriver to a tool groove 202a on the top wall of the cap nut 202 and rotate the cap nut 202, threading the screw hole 202b of the cap nut 202 onto the screw rod 102. Thus, the handle 200 is pivotally connected to the screw rod 102 of the carrier frame 100, and can be biased to move an engagement member 203 that extends from one end of the handle 200 into the opening 101 to lock the connection portion of the rack (not shown). Further, a spring member 300 is connected between a hook 204 at the periphery of the axle hole 201 of the handle 200 and a hook 103 at the border area of the opening 101, holding the handle 200 in the locking position.

According to the aforesaid design, the handle pivot structure has drawbacks as follows: (1) There is a great clearance left between the cap nut 202 of the handle 200 and the screw rod 102 after installation of the handle 200 in the carrier frame 100, causing vibration of the handle 200 and (2) Frequently rotating the handle 200 causes friction wearing between the handle 200 and the cap nut 202, loosening the connection between the handle 200 and the cap nut 202 and affecting normal functioning of the handle 200.

Therefore, it is desirable to provide a handle pivot structure that eliminates the aforesaid drawbacks.

SUMMARY OF THE INVENTION

The present invention has been accomplished under the circumstances in view. It is one object of the present invention to provide a handle pivot structure, which ensures installation stability of the handle and prevents vibration during biasing operation of the handle and, which causes relative rotation between parts of a pivot shaft when the handle is biased, avoiding wearing damage.

To achieve this and other objects of the present invention, a handle pivot structure comprises a carrier frame, which comprises a horizontal bottom panel, a vertical side panel perpendicularly extended from one side of the horizontal bottom panel, an opening cut through the intersection between the horizontal bottom panel and the vertical side panel and a screw rod vertically located on the bottom panel adjacent to one side of the opening; a flat handle, which comprises an axle hole located on one end thereof and an engagement member radially extended from the periphery of the axle hole; and a pivot shaft, which is mounted in the axle hole and comprises a mounting member, which comprises a disc-like head and a tubular shank perpendicularly extended from a bottom side of the disc-like head, the tubular shank having at least one crevice cut through the periphery thereof and a screw hole defined therein and threaded onto the screw rod of the carrier frame and a rotating member, which is peripherally affixed to the axle hole of the flat handle for synchronous movement with the flat handle and has a center through hole for the insertion of the tubular shank of the mounting member for enabling the rotating member to be rotated relative to the mounting member. When biasing the flat handle in one of two reversed directions, the rotating member is rotated with the flat handle relative to the mounting member and the screw rod, causing the engagement member to be moved with the flat handle in and out of the opening between a locking position and an unlocking position.

DETAILED DESCRIPTION OF THE PREFERRED EMBODIMENT

Figure 1:
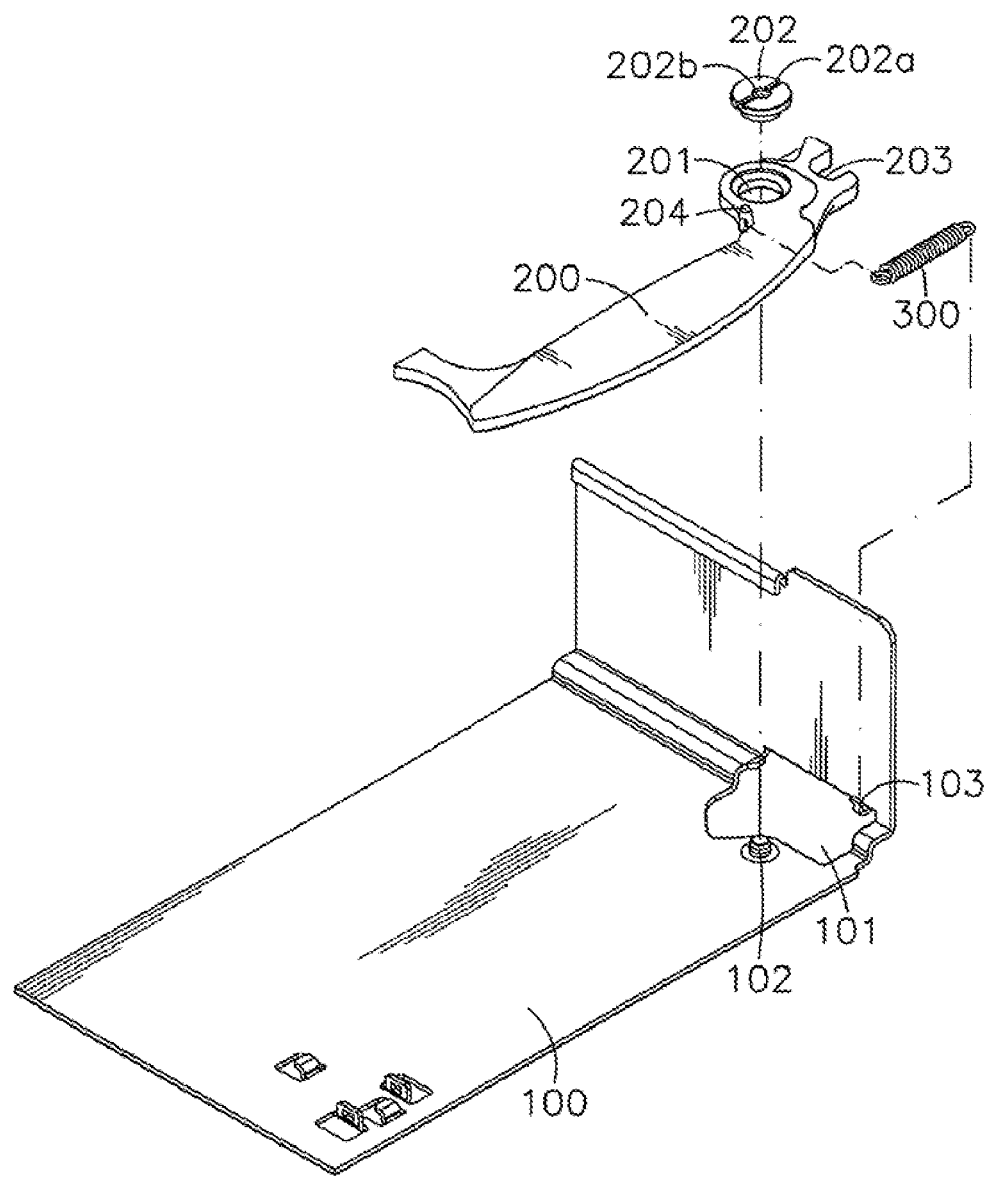
FIG. 1 is an exploded view of a handle pivot structure according to the prior art.
Figure 2:
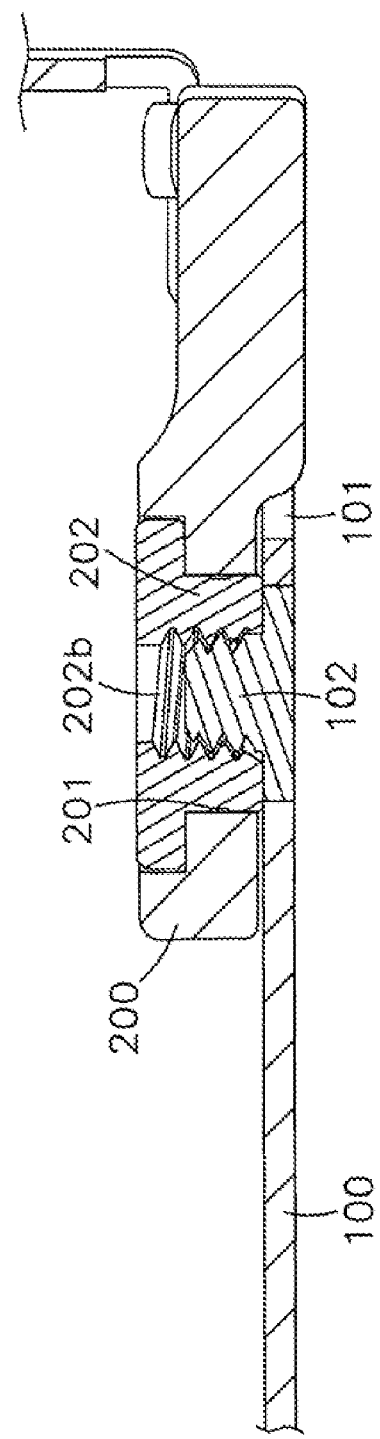
FIG. 2 is a sectional assembly view of the handle pivot structure according to the prior art.
Figure 3:
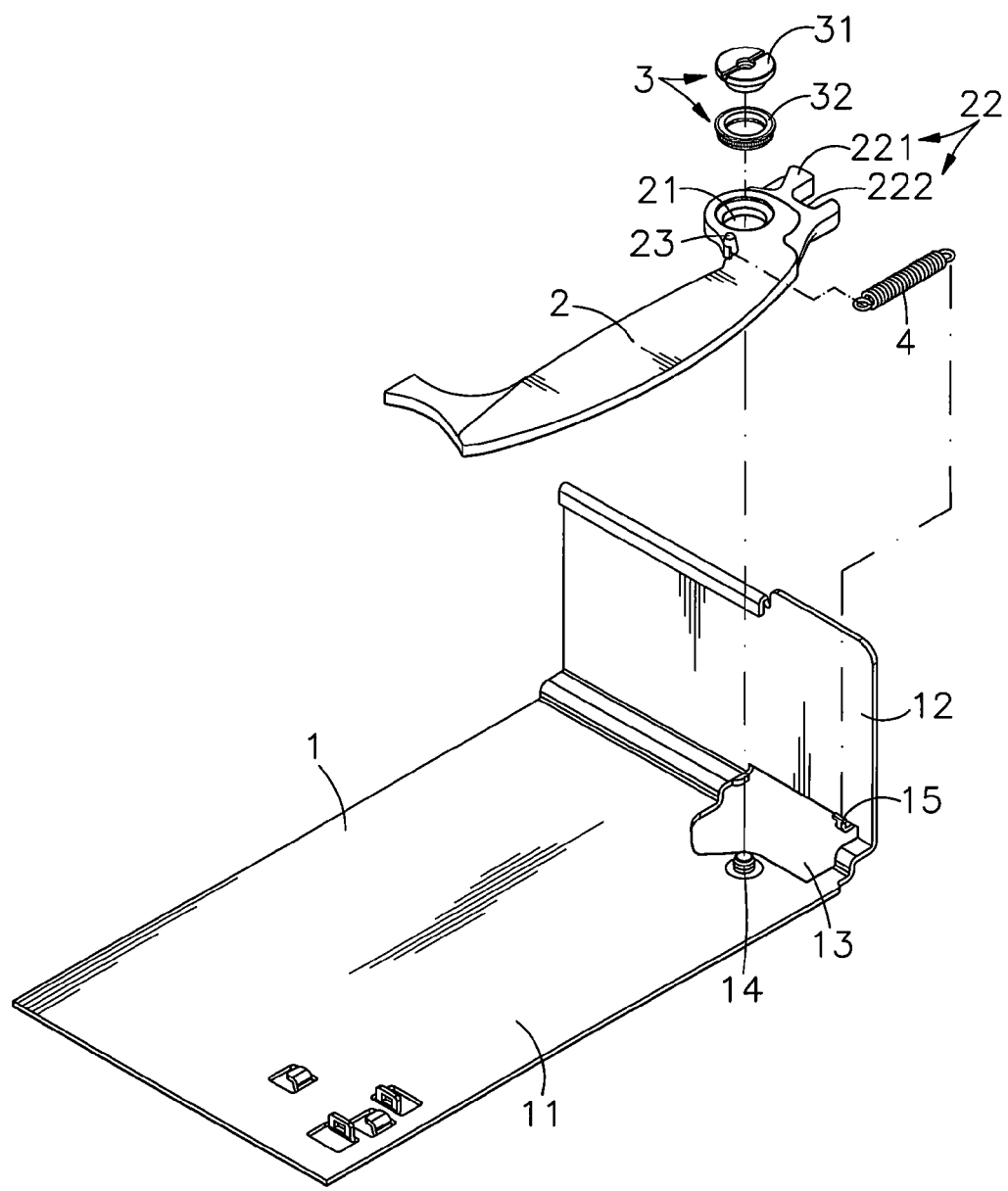
FIG. 3 is an exploded view of a handle pivot structure in accordance with the present invention.
Figure 4:
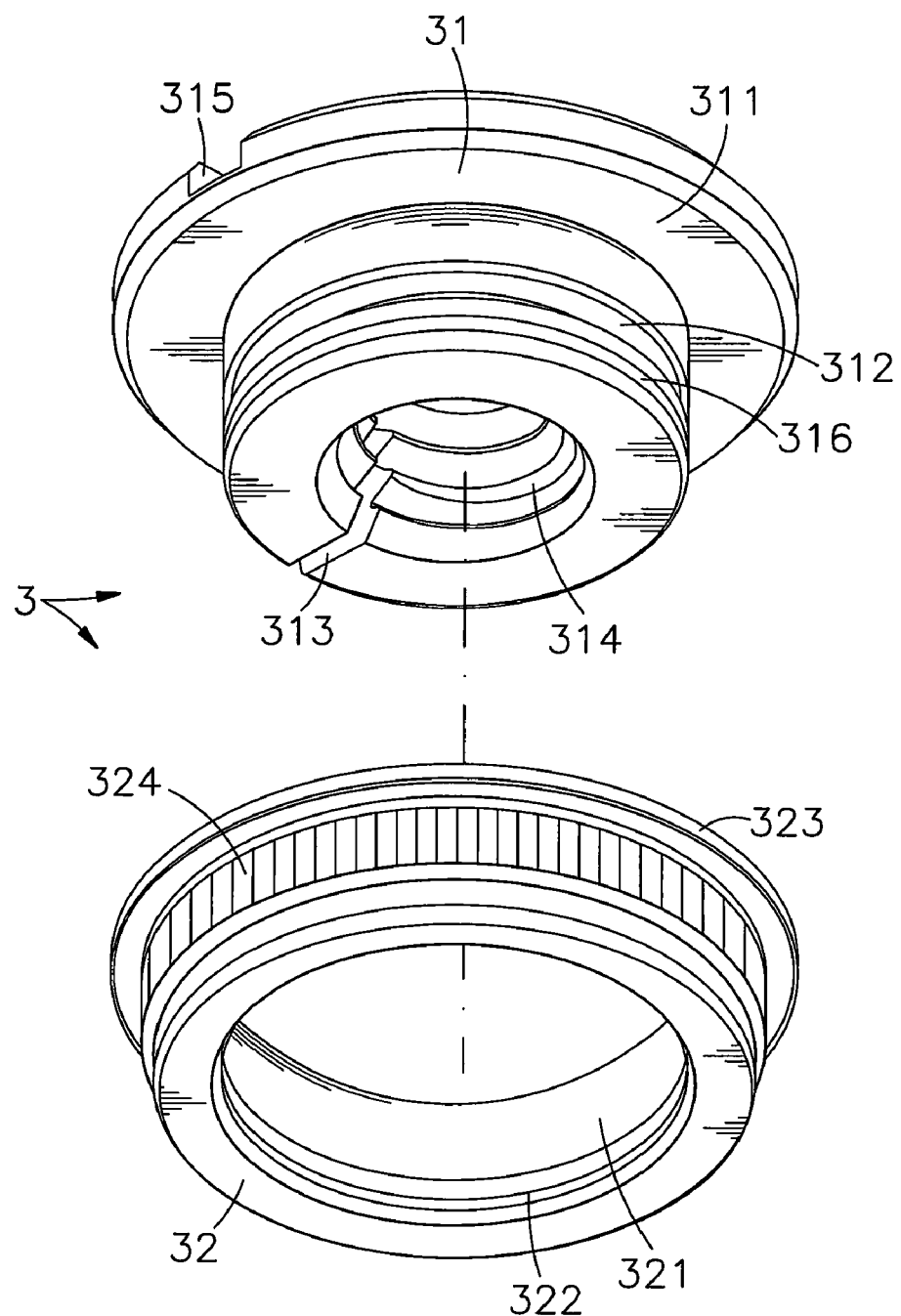
FIG. 4 is an exploded view of the pivot shaft according the present invention.
Figure 5:
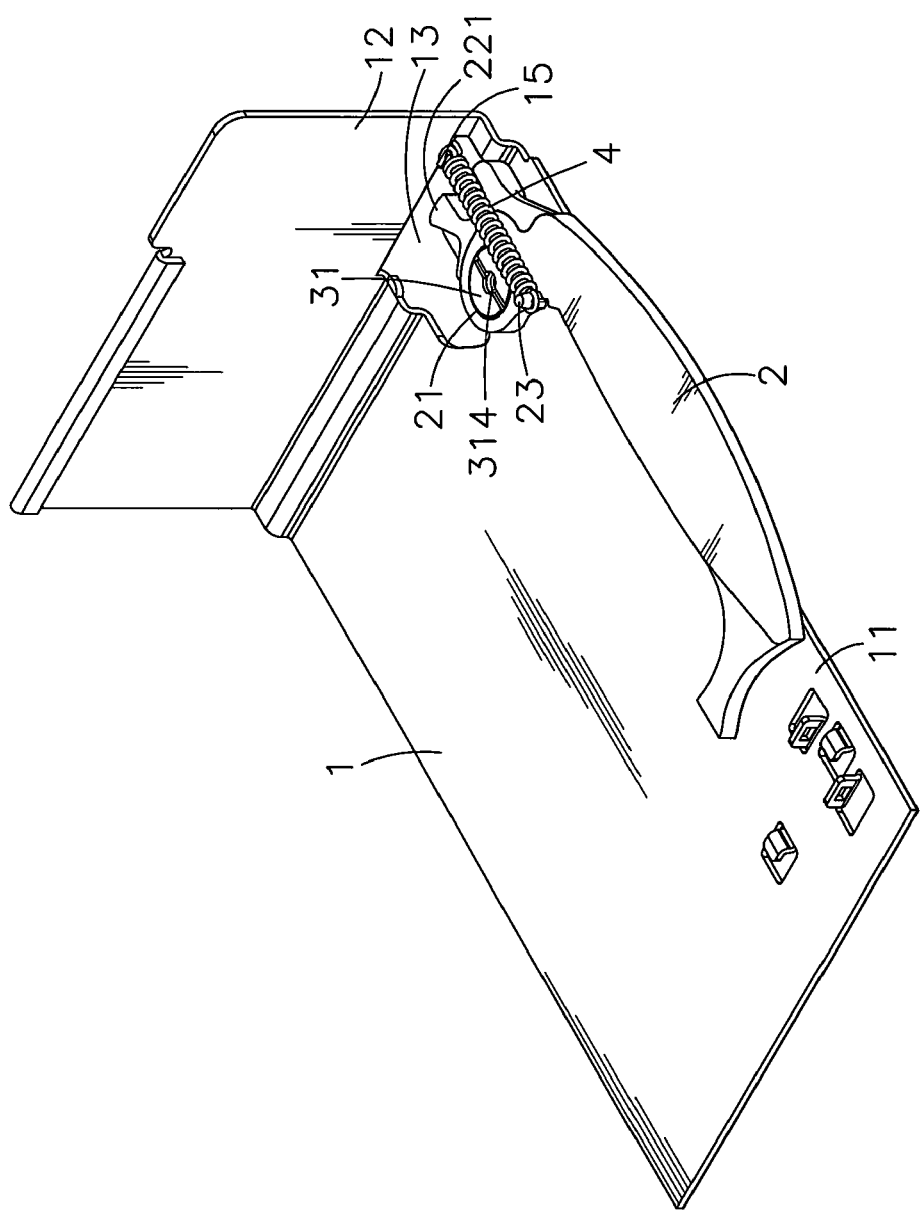
FIG. 5 is an elevational assembly view, partially cutaway, of the handle pivot structure in accordance with the present invention.
Figure 6:
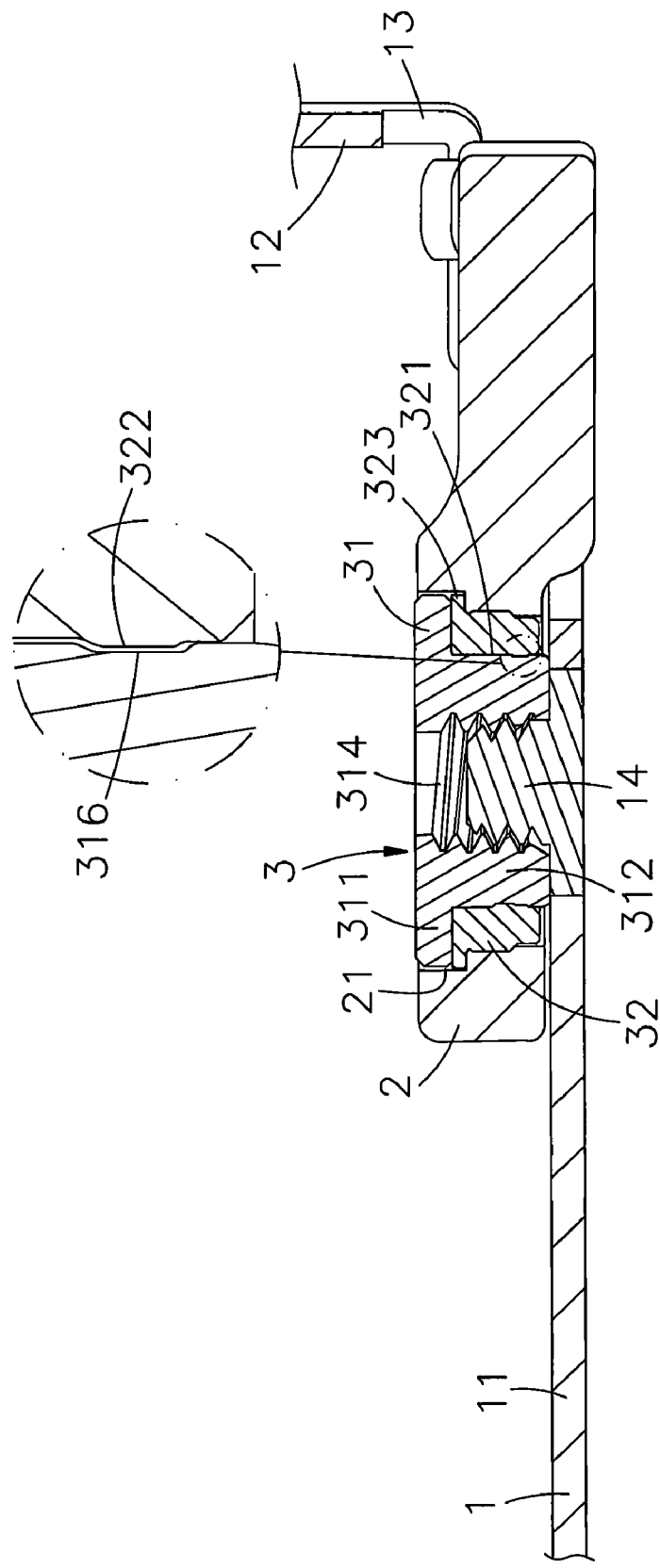
FIG. 6 is a schematic sectional view of the present invention, showing the pivot shaft fastened to the screw rod of the carrier frame.

Referring to FIGS. 3~6, a handle pivot structure in accordance with the present invention is shown comprising a carrier frame 1, a handle 2, a pivot shaft 3 and a spring member 4.

The carrier frame 1 is made from a metal sheet member through a series of cutting, stamping and bending processes, having a horizontal bottom panel 11 and a vertical side panel 12 perpendicularly extended from one side of the horizontal bottom panel 11, an opening 13 cut through the intersection between the horizontal bottom panel 11 and the vertical side panel 12, a screw rod 14 vertically located on the bottom panel 11 adjacent to one side of the opening 13 and a hook 15 protruded from the vertical side panel 12 and suspending in the opening 13 for the connection of one end of the spring member 4.

The handle 2 is a flat member having a stepped axle hole 21 located on one end thereof, an engagement member 22 radially extended from the periphery of the stepped axle hole 21 and movable with the handle 2 in and out of the opening 13 between a locking position and an unlocking position to lock/unlock a rack (not shown) and a hook 23 axially protruded from the periphery of the stepped axle hole 21 for the connection of the other end of the spring member 4. According to the present preferred embodiment, the engagement member 22 comprises two fingers 221 and a retaining groove 222 defined between the two fingers 221.

The pivot shaft 3 is formed of a mounting member 31 and a rotating member 32. The mounting member 31 comprises a disc-like head 311 and a tubular shank 312 perpendicularly extended from the bottom side of the disc-like head 311. The tubular shank 312 has at least one crevice 313 cut through the periphery. By means of at least one crevice 313, the tubular shank 312 can be radially expanded and contracted. The tubular shank 312 defines therein a screw hole 314. Further, the disc-like head 311 has a tool groove 315 on the top wall thereof for the positioning of a hand tool, for example, a screwdriver for rotating the mounting member 31. The rotating member 32 is a ring member defining a center through hole 321 into which the tubular shank 312 of the mounting member 31 is inserted for enabling the rotating member 32 to be rotated relative to the mounting member 31. To avoid disconnection between the mounting member 31 and the rotating member 32, an outside annular groove 316 and an inside annular stop flange 322 are respectively disposed around the periphery of the tubular shank 312 and the inside wall of the rotating member 32 within the center through hole 321. When the tubular shank 312 of the mounting member 31 is inserted into the center through hole 321 of the rotating member 32, the outside annular groove 316 and the inside annular stop flange 322 are coupled together, allowing rotation of the rotating member 32 relative to the mounting member 31 and prohibiting disconnection of the rotating member 32 from the mounting member 31. Further, the rotating member 32 has a rim 323 that has a diameter equal to the disc-like head 311, and an embossed engagement portion 324 on the periphery for engagement with the lower part of the stepped axle hole 21 of the handle 2 tightly so that the rotating member 32 can be biased with the handle 3 relative to the carrier frame 1.

The handle 2 is pivotally connected to the screw rod 14 of the carrier frame 1 by mounting the pivot shaft 3 in the stepped axle hole 21 of the handle 2 to force the embossed engagement portion 324 of the pivot shaft 3 into engagement with the lower part of the stepped axle hole 21 of the handle 2 tightly, and then inserting a hand tool, for example, a screwdriver into the tool groove 315 of the mounting member 31 and operating the screwdriver to rotate the mounting member 31 and to further thread the screw hole 314 of the tubular shank 312 of the mounting member 31 onto the screw rod 14. After tight engagement between the screw hole 314 of the tubular shank 312 of the mounting member 31 and the screw rod 14, the handle 2 is pivotally secured to the screw rod 14 of the carrier frame 1. Therefore, hook the two ends of the spring member 4 on the hook 23 of the handle 2 and the hook 15 of the carrier frame 1, finishing the installation of the handle pivot structure.

When biasing the handle 2 relative to the carrier frame 1, the center through hole 321 of the rotating member 32 is moved relative to the tubular shank 312 of the mounting member 31, avoiding loosening of the connection between the carrier frame and the handle due to wearing of the component parts as seen in the prior art design. Further, after installation of the handle pivot structure, the pivot shaft 3 and the handle 2 are tightly secured together, and the clearance left between the pivot shaft 3 and the handle 2 is too tiny to cause vibration of the handle 2 during movement of the handle 2 relative to the carrier frame 1.

In conclusion, the invention provides a handle pivot structure, which has the advantages as follows: By means of using a pivot shaft formed of a mounting member and a rotating member to pivotally connect the handle to the screw rod of the carrier frame, the handle can be biased with the rotating member relative to the mounting member and the carrier frame smoothly, eliminating the wearing problem between the handle and the nut of the prior art design and prolonging the work life of the handle. Further, the handle is coupled to the screw rod of the carrier frame by means of the mounting member of the pivot shaft, the clearance between the pivot shaft 3 and the handle 2 is limited, eliminating the big clearance problem of the prior art design between the nut and the screw rod at the carrier frame due to rotation of the nut with the handle and allowing biasing of the handle relative to the carrier frame smoothly and stably.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A handle pivot structure, comprising:
   a carrier frame, said carrier frame comprising a horizontal bottom panel, a vertical side panel perpendicularly extended from one side of said horizontal bottom panel, an opening cut through the intersection between said horizontal bottom panel and said vertical side panel and a screw rod vertically located on said bottom panel adjacent to one side of said opening;
   a flat handle, said flat handle comprising an axle hole located on one end thereof and an engagement member radially extended from the periphery of said axle hole; and
   a pivot shaft mounted in said axle hole, said pivot shaft comprising:
   a mounting member, said mounting member comprising a disc-like head and a tubular shank perpendicularly extended from a bottom side of said disc-like head, said tubular shank comprising at least one crevice cut through the periphery thereof and a screw hole defined therein and threaded onto said screw rod of said carrier frame; and
   a rotating member peripherally affixed to said axle hole of said flat handle for synchronous movement with said flat handle, said rotating member comprising a center through hole for the insertion of said tubular shank of said mounting member for enabling said rotating member to be rotated relative to said mounting member;
   wherein when biasing said flat handle in one of two reversed directions, said rotating member is rotated with said flat handle relative to said mounting member and said screw rod, causing said engagement member to be moved with said flat handle in and out of said opening between a locking position and an unlocking position.

2. The handle pivot structure as claimed in claim 1, wherein said pivot shaft further comprises a coupling structure adapted to secure said mounting member and said rotating member together after insertion of said tubular shaft of said mounting member into said center through hole of said rotating member for allowing said rotating member to be rotated relative to said mounting member, said coupling comprising an annular groove located on one of said mounting member and said rotating member and an annular flange located on the other of said mounting member and said rotating member.

3. The handle pivot structure as claimed in claim 1, wherein said engagement member comprises two fingers and a retaining groove defined between said two fingers.

4. The handle pivot structure as claimed in claim 1, wherein said disc-like head of said mounting member comprises a tool groove located on a top side thereof.

5. The handle pivot structure as claimed in claim 1, wherein said rotating member comprises a rim having a diameter equal to said disc-like head of said mounting member and an embossed engagement portion on the periphery thereof for engagement with said axle hole of said handle tightly.

6. The handle pivot structure as claimed in claim 1, further comprising a spring member connected between a first hook being located on said carrier frame and suspending in said opening of said carrier frame and a second hook being located on said handle adjacent to said axle hole.

* * * * *